United States Patent [19]
Winter

[11] Patent Number: 5,461,317
[45] Date of Patent: Oct. 24, 1995

[54] DEVICE FOR TESTING FOR A HIGH VOLTAGE ON THE CHASIS OF A PIECE OF ELECTRONIC APPARATUS

[75] Inventor: Robert A. Winter, Sioux Falls, S. Dak.

[73] Assignee: Bowden's Automated Products, Inc., Viborg, S. Dak.

[21] Appl. No.: 247,676

[22] Filed: May 23, 1994

[51] Int. Cl.$^6$ ................................................. G01R 31/02
[52] U.S. Cl. ........................ 324/511; 324/508; 324/510; 340/647
[58] Field of Search ................................... 324/508, 509, 324/510, 511, 555; 340/647, 650

[56] References Cited

U.S. PATENT DOCUMENTS

| | | | |
|---|---|---|---|
| 3,176,219 | 3/1965 | Behr | 324/508 |
| 3,878,458 | 4/1975 | Muska | 324/511 X |
| 4,338,648 | 7/1982 | Subbarao | 340/647 X |
| 4,352,058 | 9/1982 | Westra | 324/510 |

Primary Examiner—Kenneth A. Wieder
Assistant Examiner—Diep Do
Attorney, Agent, or Firm—Patnaude, Videbeck & Marsh

[57] ABSTRACT

A device for testing for leakage of electronic equipment has a female AC connector for receiving the male AC connector of the electronic equipment to be tested and a male AC connector for attaching the test device to a source of AC power. The device also includes an electrically conductive probe and a meter for detecting a voltage on a surface contacted by the probe. Within the device are first and second switches which connect the male AC connector and the female AC connector in four successive configurations for applying AC power to the connector of the piece of equipment to be tested. A sequencing circuit in the device operates the two switches to apply all four test configurations within an interval of 1.033 seconds. The probe and the meter for detecting a current in the probe is used to contact the conductive surfaces of the piece of equipment being tested to detect a voltage while the four tests are applied to the power connector.

6 Claims, 3 Drawing Sheets

DEVICE FOR TESTING FOR A HIGH VOLTAGE ON THE CHASIS OF A PIECE OF ELECTRONIC APPARATUS

The present invention relates to a method and apparatus for testing electrical equipment for leakage and, in particular, to a method and apparatus to be used by service technicians to test the electrically conductive surfaces of such equipment for a voltage resulting from such leakage.

BACKGROUND OF THE INVENTION

A piece of electronic equipment typically has several electrically conductive exterior surfaces. When the equipment is properly manufactured and maintained, the electrically conductive surfaces are insulated against leakage from the interior circuitry of the apparatus. In the event the insulating barriers between the electrically conductive exterior surfaces and the inner components of an electronic device fail as a result of damage or deterioration, a charge may develope on the conductive exterior surfaces of the apparatus, which could cause injury to an operator and damage to other electronic equipment.

Hospitals and clinics and other medical facilities which use numerous pieces of electronic equipment are regulated by one or more agencies, including the Joint Commission on Accreditation of Health Care Organizations. The Joint Commission has recommended that all hospital electronic equipment with which a patient can come into contact should be tested twice a year for electronic leakage. The Commission has further recommended that equipment used in certain critical areas be tested four times a year.

Some electrical equipment safety standard organizations, such as Underwriter's Laboratories and Canadian Standards Association, have provided a standardized safety test which should be used to detect and measure electrical leakage to the exposed conductive surfaces of a piece of electronic equipment. The standardized safety test recommends that a 1,000 Ohm load be used in parallel with a volt meter to measure any leakage to each conductive outer surface of electrical equipment while four successive tests are applied to the equipment. Such equipment typically has a standard AC plug or male connector with a high voltage contact, a low voltage contact, and ground contact. In the first test, the connector from the equipment is properly attached to a source of AC current, that is, the high voltage side of an AC source is applied to the high voltage contact of the connector, the low voltage side of an AC source is applied to the low voltage contact and the ground of the connector is grounded. In the second test, the high and low sides of a source of AC power are reversed. The high side of a source of AC power is applied to the low voltage contact of the connector, the low side of the source of AC power is applied to the high voltage contact, and the ground contact of the AC connector is grounded. In the third test, the high side of the source of AC power is again connected to the high voltage contact of the connector from the equipment, and the low side of the source of AC power is connected to the low voltage contact of the connector and the ground contact of the male connector is left unconnected. In the fourth test, the high and low sides of the source of AC power are again reversed as in the second test, and the ground contact from the connector left disconnected.

The foregoing tests are conducted by applying AC power for one of the test configurations to the male connector of the equipment to be tested, and thereafter, contacting a probe in series with a resistor and volt meter against successive exterior surfaces of the equipment until all surfaces have been tested for leakage. Thereafter, a second configuration is applied to the connector of the equipment and the probe again contacted against all the exterior surfaces of the equipment. Where the equipment to be tested has a large number of isolated conductive exterior surfaces, as for example, where there are a plurality of metal bolts extending through a wooden chassis, each of the four tests can consume a substantial period of time. As a result of the time consumed to perform all four tests, some hospitals have chosen to omit one or more of the tests, or have chosen to undertake tests less frequently than recommended.

Therefore, it would be desirable to provide a test device which would simplify the testing procedure such that all four of the tests could be made by contacting a probe once to each of the electrically conductive surfaces of the equipment to be tested.

SUMMARY OF THE INVENTION

Briefly, the present invention is embodied in a device for testing for leakage of electronic equipment which has a chassis with one or more electrically conductive outer surfaces and a male AC power connector having a high voltage contact, a low voltage contact and a ground contact. The test device has a female AC connector for receiving the male AC connector of the electronic equipment to be tested and a male AC connector for attaching the test device to a source of AC power. The device also includes an electrically conductive probe and a meter for detecting a voltage on a surface contacted by the probe. Within the device is a first switch means which is connected between the male AC connector and the female AC connector and has a first and second switch position. In one of the switch positions of the first switch means, the high voltage contact of the male connector is attached with the high voltage contact of the female connector and the low voltage contact of the male connector is attached to the low voltage contact of the female connector and in the other switch position, the high voltage contact of the male connector is connected to the low voltage contact of the female connector and the low voltage contact of the male connector is connected to the high voltage contact of the female connector. A second switch means is also positioned between the ground of the male connector and the ground of the female connector and has first and second switch positions. In one of the switch positions the ground contacts are connected to each other and in the other of the switch positions the ground contacts are disconnected from each other.

A sequencing means connected to the first and second switch means actuates the two switching means through a repetitive sequence during the course of which both switch means are simultaneously in a first position, the first of the switch means is in a second position and the second switch means is in a first position, the first switch means is in a first position and the second switch means is in a second position, and both switch means are in the second position. Where the sequencing means consists of a solid state sequencing circuit operating solid state relays, AC power can be connected to the AC connector of a piece of equipment to be tested in all four of the configurations within a period of time of approximately one second. The present invention also includes an electrically conductive probe which is connected to ground, and a meter to detect any current passing through the probe.

A device in accordance with the present invention can be used to test a piece of equipment by attaching the equipment into the female AC connector of the device and inserting the male AC connector from the device into a typical AC outlet. Thereafter, the probe is contacted against the electrically conductive surfaces of the chassis of the equipment to be tested and the probe is retained against each surface for a period in excess of one second. During each one second test, the device in accordance with the present invention will apply each of the four configurations of power to the AC connector of the device to be tested and the meter will read the maximum voltage detected by the probe on the conductive surfaces thereof.

BRIEF DESCRIPTION OF THE DRAWINGS

A better understanding of the present invention can be had from a review of the following detailed description taken in conjunction with the accompanying drawings wherein.

DETAILED DESCRIPTION OF A PREFERRED EMBODIMENT

Figure 1:
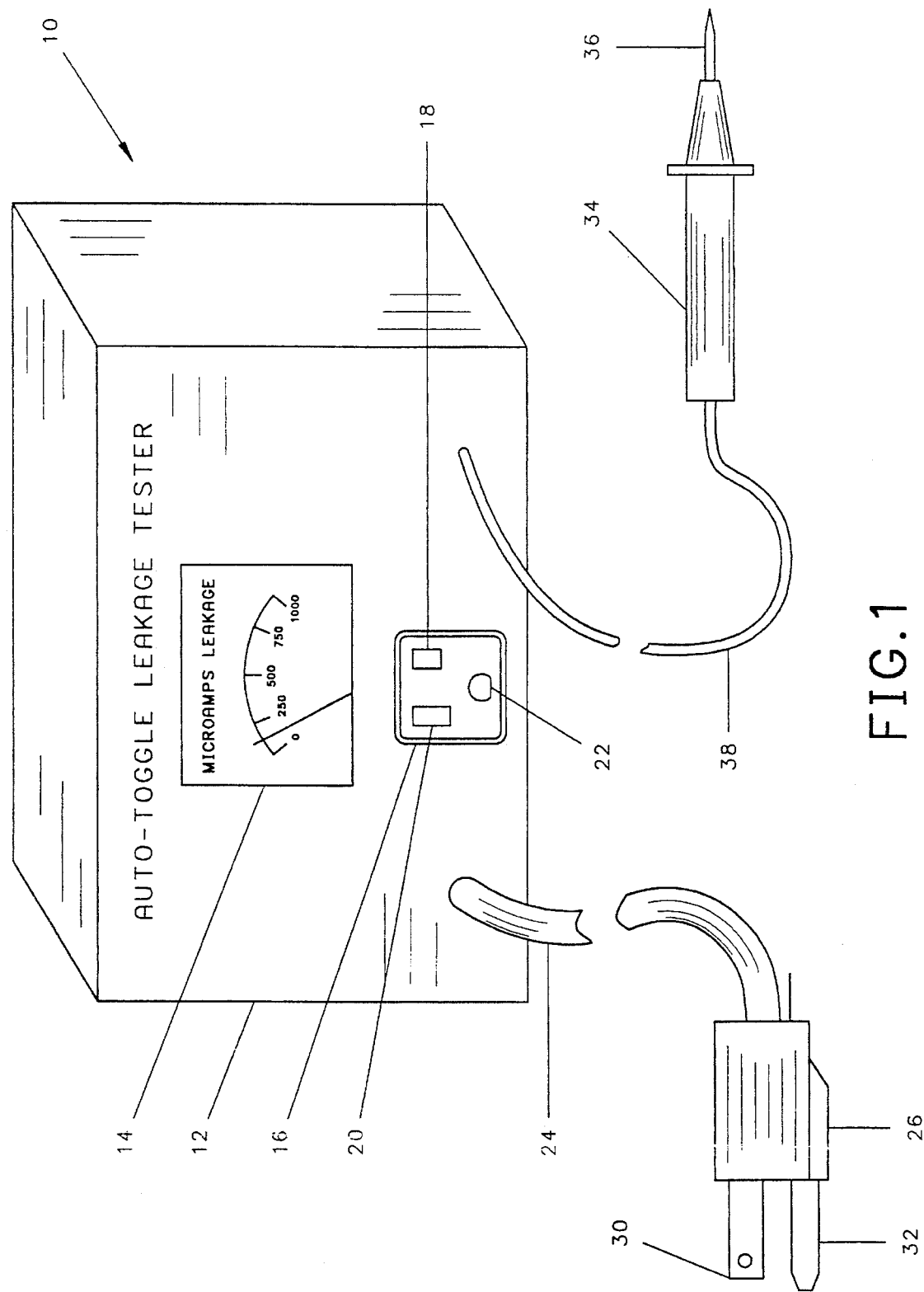
FIG. 1 is a front isometric view of a test device embodying the present invention.

Referring to FIG. 1, a test device 10 has an enclosure 12, a meter 14 and a female AC connector 16 having a high voltage contact 18, a low voltage contact 20 and a ground contact 22. Extending from the enclosure 12 is a power line 24 at the end of which is a male AC connector 26 having a high voltage male contact 28 a low voltage male contact 30 and a ground male contact 32. The device also includes a test probe 34 having electrically conductive tip 36 and an insulated lead 38.

Figure 2:
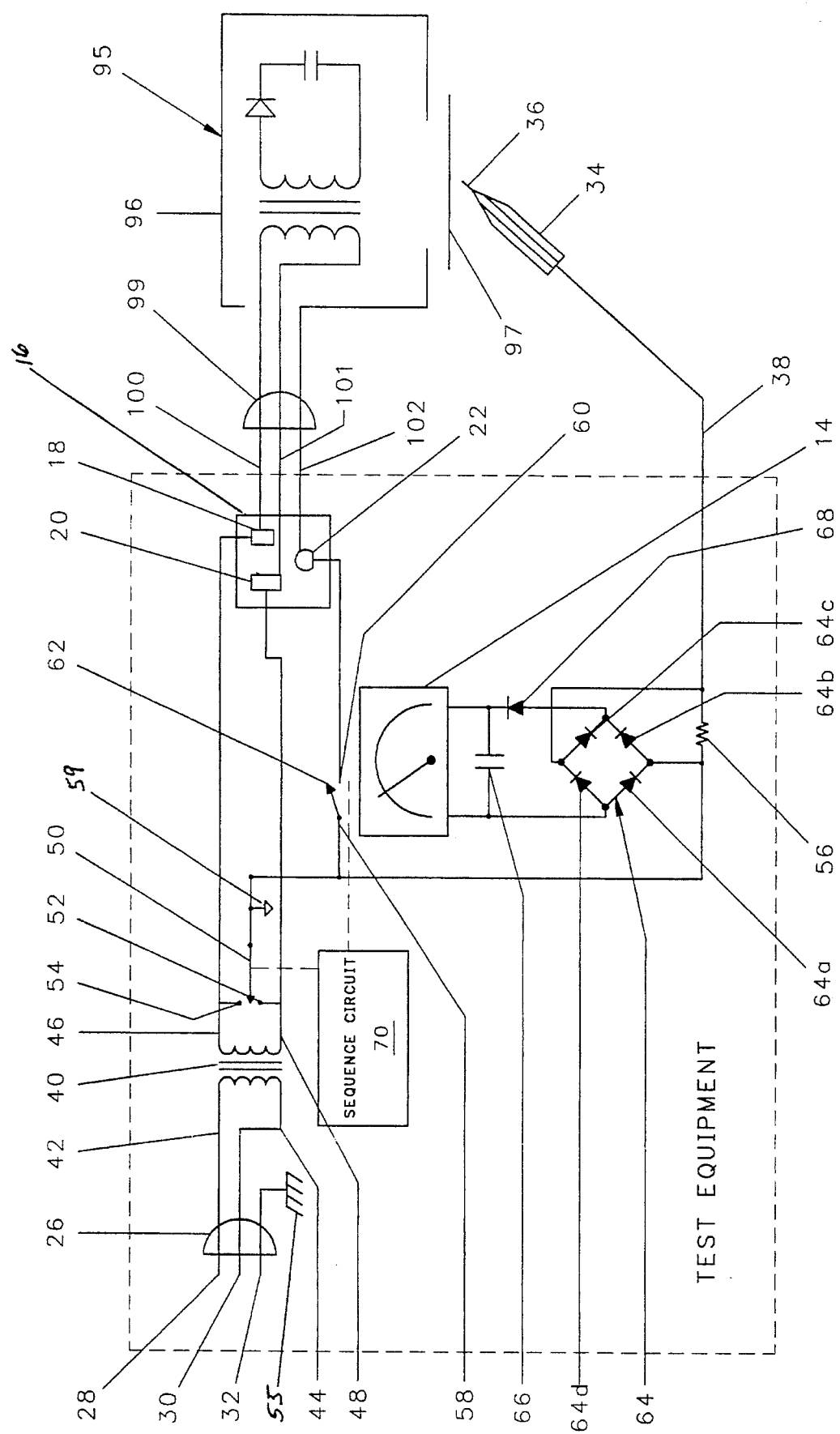
FIG. 2 is a schematic circuit diagram of the test device shown in FIG. 1.

Referring to FIG. 2, it can be seen that the device further includes an isolating transformer 40 having input leads 42, 44 which are electrically connected to the high and low contacts 28, 30 of the AC connector 26. The output leads 46, 48 of the transformer 40 are connected through a first switch 50 to the high and low female contacts, 18, 20, respectively, of the AC connector 16. The first switch means 50 has a first position 52 in which the high AC voltage from the transformer 40 is applied to the high voltage terminal 18 of the female connector 16 and the low voltage AC power is applied to the low voltage terminal 20 of the connector 16. The switch 50 also has a second position 54 in which high voltage from the transformer 40 is applied to the low voltage terminal 20 of the connector 16 and the low voltage from the transformer 40 is applied to the high voltage terminal 18 of the connector 16.

The male ground contact 32 of the AC connector 26 is grounded at 55 to the chassis of the device. The insulated lead 38 of the probe 34 is connected to one end of a first resistor 56, the other end of which is connected to a second switch means 58 to a measurement reference 59 which is also connected to the ground contact 22 of the AC outlet 16. The second switch means 58 has a first switch position 60 in which the measured reference 59 is electrically connected to the female ground contact 22 of the AC connector 16, and a second switch position 62 where the measurement reference 59 and contact 22 are disconnected from each other.

A bridge rectifier 64 having four diodes 64a, 64b, 64c, 64d, is connected on each side of the first resistor 56 and converts any AC current in the lead 38 of the probe to DC current which can be read by the volt meter 14. The volt meter 14 is also in parallel with a capacitor 66 which stores the maximum voltage applied to the meter 14, and the volt meter 14 and capacitor 66 are isolated from the circuit by a fifth diode 68.

Figure 3:
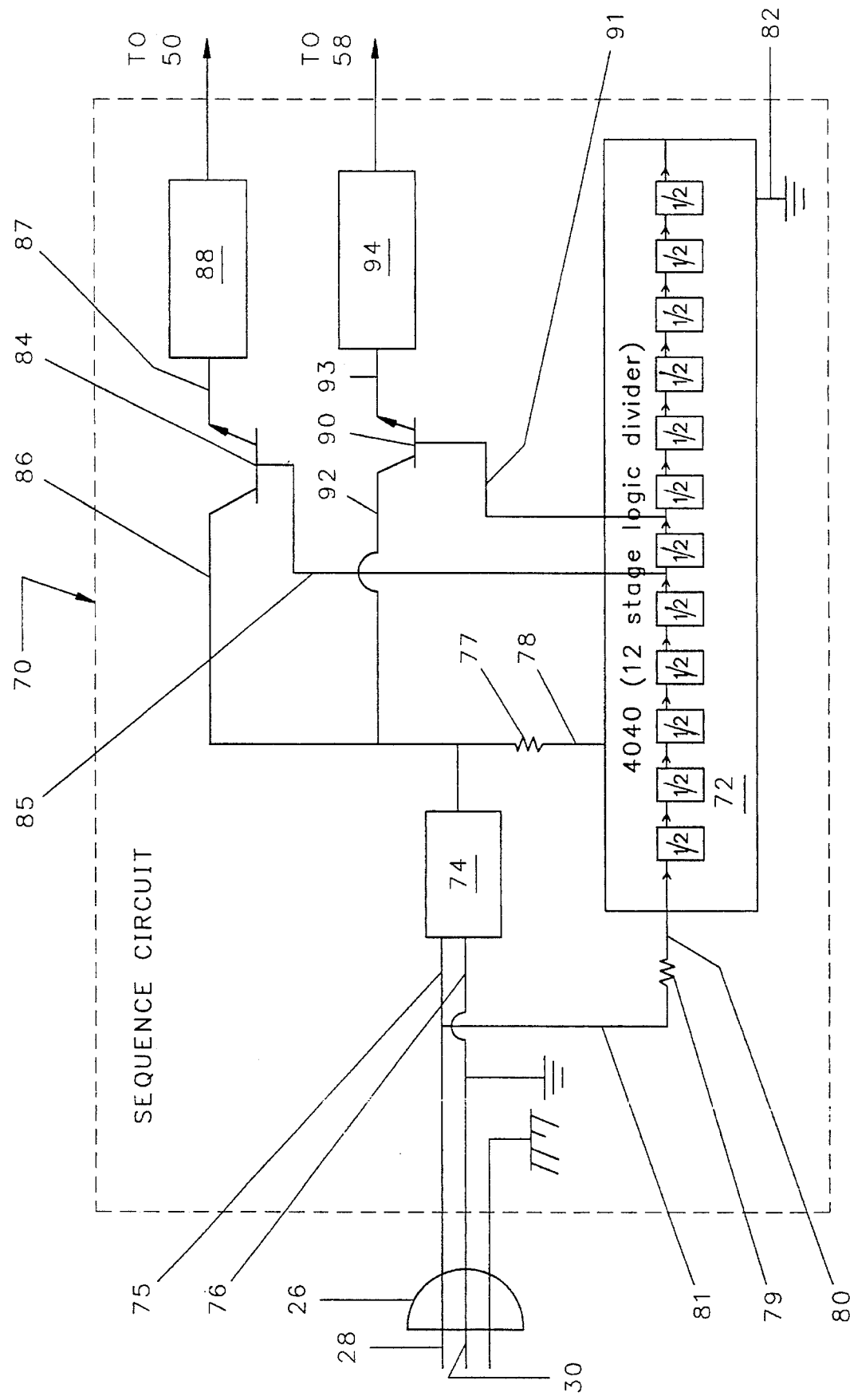
FIG. 3 is a schematic diagram of a typical sequencing circuit to be used in the circuit shown in FIG. 2.

Referring to FIGS. 2 and 3, the first and second switch means 50, 58 are controlled by a sequencing circuit 70. In the preferred embodiment, the sequencing circuit 70 includes an integrated circuit twelve stage logic divider 72, commonly known as a 4040 IC which has twelve successive stages, each of which divides the frequency of the preceding stage in half. A rectifier circuit 74 having input leads 75, 76 is connected to the high and low contacts 28, 30 of the connector 26 and converts AC power to DC. A second resistor 77 in series with the output of the rectifier circuit 74 and the power input 78 of the logic divider 72 reduces the voltage of the power from the rectifier circuit 74 to a level which will not harm the logic divider 72. A third resistor 79 is connected in series between the signal input 80 of the logic divider 72 and AC power from the connector 26 by leads 81, 82 to apply 60 Hz power to the logic divider 72 without causing damage thereto.

A first transistor 84 has its base connected by a lead 85 after the fifth stage of the logic divider 72 such that power applied to the base of transistor 84 is at a frequency of 1.875 Hz. The collector of the first transistor 84 is connected by a lead 86 to the DC power from the rectifier 74 and the emitter is connected by a lead 87 to a first electronic relay 88, which operates the first switch means 50.

A second transistor 90 has its base connected by a lead 91 between the sixth and seventh stages of the logic divider 72 such that the frequency of AC current applied to the base of the second transistor 90 is 0.9375 Hz. The collector of the second transistor 90 is also connected by a lead 92 to the DC power from the rectifier 74 and the collector is attached by another lead 93 to a second electronic relay 94 which operates the second switch means 58. The sequencing circuit 70 will cause the first switch means 50 to switch from a first position to a second position, or from a second position to a first position every 0.2666 seconds. Similarly, the sequencing circuit 70 will cause the second switch means 58 to alternate between a first and second switching position every 0.5333 seconds. Also, since the two switch means 50, 58 have parallel circuity positioned one stage apart from each other on the logic divider 72, the switching of the second switch means 58 will always occur in synchronization with the alternate switching of the first switch means 50. Over the interval of 1.033 seconds, the sequencing circuit 70 will then cause the first switch means 50 to be at a first position 52 for approximately ¼ second and then to a second position 54 for approximately ¼ second while the second switch means 58 remains in a first position 60. Thereafter, the first switch means 50 will return to the first switch position 54 and the second switch means 58 simultaneously will move to a second switch position 62. The second switch means 58 will remain in the second switch position 62 for approximately ½ second, and the first switch means will remain in the first position 52 for approximately ¼ second and thereafter be moved to the second switch position 54 for an additional ¼ second. The cycle will end with both switch means 50, 58 being returned to the first switch positions 52, 60, respectfully.

As a result of the sequencing, the high voltage from contact 28 of the male AC connector 26 will be effectively applied through the transformer 40 to the high voltage contact 18 of the female AC connector 16 and the low voltage from contact 30 of the connector 26 will be effectively applied through the transformer 40 to the low voltage contact 20 of the connector 16 for a period of 0.2666 seconds, during which the ground contact 22 will be connected to the reference 59. This will have the same effect as though contacts 32 and 22 of the connector 26 and outlet 16 were connected to each other. Thereafter, for a period of 0.2666 seconds, the high voltage contacts 28 of the male connector 26 will be effectively attached to the low voltage contact 20 of the female connector 16 and the low voltage contact 30 will be effectively attached to the high voltage contact 18 of the female connector 16 while the ground contacts 32, 22 remain effectively connected to each other. During the next 0.2666 seconds, the AC high voltage contact 28 of connector 26 will again be effectively connected to the high voltage contact 18 of connector 16 and the low voltage contact 30 will be effectively connected to the low voltage contact 20 and the ground contacts 32, 22 of the connectors 26 and 16 will be disconnected from each other. In the last 0.2666 seconds the high voltage contact 28 of the connector 26 will be effectively connected to the low voltage contact 20 of connector 16, the low voltage contact 20 will be effectively connected to the high voltage contact 18 and the grounds 32, 22 will remain disconnected from each other.

It will also be appreciated that the sequencing circuit 70 as described above will cause the switching means 50, 58 to switch when the AC power is crossing zero potential, thereby causing a minimum of noise in the lines and in the equipment being tested.

Referring to FIG. 2, a piece of equipment to be tested 95 has a chassis 96 with at least one exterior conductive surface 97 and a power line. At the end of the power line is a male AC connector 99 having a high voltage contact 100, a low voltage contact 101, and a ground contact 102. When the connector 99 of the equipment 95 is inserted into the female AC connector 16 of the device 10, power will be applied to the connector 99 for 0.2666 seconds for each of the four test configurations.

To use the device in accordance with the present invention, the AC connector 26 is inserted into a common AC power outlet and the AC connector 99 for a piece of equipment to be tested 95 is inserted into the female AC connector 16. Thereafter, the tip 36 of the probe 34 is touched to the electrically conductive surfaces 97 of the piece of equipment 95. The tip 36 of the probe 34 is kept in contact with each conductive surface 97 of the piece of equipment 95 for a period of at least 1.066 seconds during which the four tests are applied. In the event that a leakage is detected and a charge is found on one of the conductive surfaces 97 of the piece of equipment 95, the meter 14 will detect a current through the rectifier 64 and the voltage retained for a period of time in the capacitor 66. If no leakage is found on a conductive surface, the probe can be moved to a second conductive surface of the apparatus to be tested where it is also retained for a period of at least 1.066 seconds, and the test repeated. As a result, all of the electrically conductive surfaces of a piece of equipment can be tested for leakage by contacting the probe to each of the electrically conductive surfaces for a period of at least 1.066 seconds.

While one preferred embodiment of the present invention has been disclosed, it will be apparent to those skilled in the art that many changes and modifications may be made without departing from the true spirit and scope of the invention. It is, therefore, the purpose of the appended claims to cover all such changes and modifications that fall within the true spirit and scope of the invention.

What is claimed:

1. A test device for testing against leakage of a piece of electronic equipment having at least one electrically conductive outer surface and a male AC power connector with a high voltage contact, a low voltage contact and a ground contact said device comprising in combination:

a female AC connector for receiving a male AC connector for applying electric energy to a piece of equipment, said female AC connector having a high voltage contact, a low voltage contact and a ground contact, a probe, means for connecting said probe to ground, means for detecting a current in said probe, a male AC connector for connecting said device to a source of AC power, said male AC connector having a high voltage contact, a low voltage contact and a ground contact adapted for insertion of said male AC connector into a conventional female connector of the type used as an outlet for electric energy, a first switch means connected between said male AC connector and said female AC connector, said first switch means having a first and a second position, one of said first and second positions of said first switch means wherein said high voltage contact of said male AC connector is connected to said high voltage contact of said female AC connector and said low voltage contact of said male AC connector is connected to said low voltage contact of said female AC connector, and the other of said first and second switching position wherein said high voltage contact of said male AC connector is connected to said low voltage contact of said female AC connector and said low voltage contact of said male AC connector is connected to said high voltage contact of said female AC connector, a second switch means connected between said ground of said male AC connector and said ground of said female AC connector, and having a first position and a second position, one of said first and second positions of said second switch means wherein said ground contacts of said male AC connector and said female AC connector are electrically connected to each other and the other of said first and said second positions wherein said ground contacts are electrically disconnected from each other, and sequencing means connected to said first and second switch means for successively configuring both of said switch means in a first position, said first switch means in a second position and said second switch means in a first position, said first switch means in a first position and said second switch means in a second position, and both of said switch means in a second position.

2. A test device in accordance with claim 1 further comprising an insulating transformer between said male AC connector and said first switch means.

3. A test device in accordance with claim 1 wherein said means for detecting a current is a meter, and further comprising rectifier means for rectifying AC current in said probe to said meter.

4. A test device in accordance with claim 3 further comprising a capacitor in parallel with said meter and an isolating diode in series with said meter and said capacitor.

5. A test device in accordance with claim 1 wherein said sequencing circuit includes a multistage logic divider for operating a pair of electronic relays to actuate said first switch means and said second switch means.

6. The method of testing for leakage in electronic equipment having a chassis with a plurality of electrically conducted surfaces and a male AC power connector having a high voltage contact, a low voltage contact, and a ground contact, comprising the steps of:

applying an automated series of power configurations to said male AC power connector, said automated series of power configurations comprising, applying the high side of a source of AC power to said high voltage contact, the low side of a source of AC power to said low voltage contact and grounding said ground contact, applying the low side of a source of AC power to said high voltage contact, the high side of a source of AC power to said low voltage contact while said ground contact is grounded, applying the high side of a source of AC power to said high voltage contact and the low side of a source of AC power to said low voltage contact while said ground contact is disconnected from ground, applying the low side of a source of AC power to said high voltage contact and the high side of a source of AC power to said low voltage contact while said ground contact is disconnected from ground, providing a probe connected to ground, providing a means for detecting a current in said probe, contacting said probe to a first of said plurality of electrically conductive surfaces of said electronic equipment while said series of automated configurations of power are applied to said male AC power connector, and applying said probe to a second of said plurality of electrically conductive surfaces while said series of automotive configurations of power is applied to said male AC power connector.

* * * * *

UNITED STATES PATENT AND TRADEMARK OFFICE
CERTIFICATE OF CORRECTION

PATENT NO. : 5,461,317
DATED : October 24, 1995
INVENTOR(S) : Robert A. Winter

It is certified that error appears in the above-indentified patent and that said Letters Patent is hereby corrected as shown below:

On the title page, item [54] and column 1, line 2, after "THE" delete "CHASIS" and substitute --CHASSIS--.

Column 7, lines 3-4, delete "conducted" and substitute --conductive--.

Signed and Sealed this

Nineteenth Day of March, 1996

Attest:

BRUCE LEHMAN

*Attesting Officer*          *Commissioner of Patents and Trademarks*